(12) United States Patent
Kusaba et al.

(10) Patent No.: US 9,240,452 B2
(45) Date of Patent: Jan. 19, 2016

(54) ARRAY AND MOAT ISOLATION STRUCTURES AND METHOD OF MANUFACTURE

(71) Applicant: INTERNATIONAL BUSINESS MACHINES CORPORATION, Armonk, NY (US)

(72) Inventors: Naoyoshi Kusaba, Hopewell Junction, NY (US); Oh-jung Kwon, Hopewell Junction, NY (US); Zhengwen Li, Danbury, CT (US); Hongwen Yan, Somers, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/149,280

(22) Filed: Jan. 7, 2014

(65) Prior Publication Data

US 2014/0124952 A1    May 8, 2014

Related U.S. Application Data

(62) Division of application No. 13/274,389, filed on Oct. 17, 2011, now Pat. No. 8,673,737.

(51) Int. Cl.
*H01L 29/06* (2006.01)
*H01L 29/423* (2006.01)
*H01L 27/108* (2006.01)
(Continued)

(52) U.S. Cl.
CPC ............ *H01L 29/423* (2013.01); *H01L 21/762* (2013.01); *H01L 27/1087* (2013.01); *H01L 27/10805* (2013.01); *H01L 27/10829* (2013.01); *H01L 29/66181* (2013.01); *H01L 29/945* (2013.01)

(58) Field of Classification Search
CPC .................................................. H01L 27/10829
USPC ................... 257/304, 622, E27.092; 438/427
See application file for complete search history.

(56) References Cited

U.S. PATENT DOCUMENTS

| 4,745,081 A * | 5/1988 | Beyer et al. ................... 438/429 |
| 6,667,226 B2 | 12/2003 | Pinto et al. |

(Continued)

OTHER PUBLICATIONS

Disclosed Anonymously, "Simultaneously forming deep trench isolation and deep trench capacitor on the same chip," IP.com Electronic Publication, IPCOM000198808D, Aug. 17, 2010, 3 pages.

*Primary Examiner* — Robert Huber
(74) *Attorney, Agent, or Firm* — Yuanmin Cai; Andrew M. Calderon; Roberts Mlotkowski Safran & Cole, P.C.

(57) ABSTRACT

An array or moat isolation structure for eDRAM with heterogeneous deep trench fill and methods of manufacture is provided. The method includes forming a deep trench for a memory array and an isolation region. The method further includes forming a node dielectric on exposed surfaces of the deep trench for the memory array and the isolation region. The method further includes filling remaining portions of the deep trench for the memory array with a metal, and lining the deep trench of the isolation region with the metal. The method further includes filling remaining portions of the deep trench for the isolation region with a material, on the metal within the deep trench for the memory array. The method further includes recessing the metal within the deep trench for the memory array and the isolation region. The metal in the deep trench of the memory array is recessed to a greater depth than the metal in the isolation region.

15 Claims, 6 Drawing Sheets

(51) Int. Cl.
  *H01L 29/66* (2006.01)
  *H01L 29/94* (2006.01)
  *H01L 21/762* (2006.01)

(56) References Cited

U.S. PATENT DOCUMENTS

| | | | |
|---|---|---|---|
| 6,838,724 B2 | 1/2005 | Kowalski et al. | |
| 6,885,080 B2 | 4/2005 | Chen et al. | |
| 6,963,113 B2 | 11/2005 | Ang et al. | |
| 7,323,379 B2 | 1/2008 | Sinitsky et al. | |
| 7,439,603 B2 | 10/2008 | Jung et al. | |
| 7,791,163 B2 | 9/2010 | Kuroi et al. | |
| 8,470,684 B2 | 6/2013 | Pei et al. | |
| 2003/0162400 A1* | 8/2003 | Chen et al. | 438/694 |
| 2006/0261444 A1 | 11/2006 | Grivna et al. | |
| 2011/0133310 A1 | 6/2011 | Anderson et al. | |
| 2011/0193193 A1 | 8/2011 | Dube et al. | |

* cited by examiner

ARRAY AND MOAT ISOLATION STRUCTURES AND METHOD OF MANUFACTURE

FIELD OF THE INVENTION

The invention relates to semiconductor structures and, more particularly, to array and moat isolation structures for eDRAM with heterogeneous deep trench fill and methods of manufacture.

BACKGROUND

Embedded Dynamic Random Access Memory (eDRAM) is a capacitor based memory integrated on the same die as an ASIC or processor. The cost-per-bit is typically higher than for stand-alone DRAM chips but in many applications the performance advantages of placing the eDRAM on the same chip as the processor outweighs the cost disadvantage compared with external memory.

Embedding memory on the ASIC or processor allows for much wider busses and higher operation speeds. And, due to much higher density of DRAM (in comparison to SRAM), larger amounts of memory can be installed on smaller chips. However, eDRAM requires additional fabrication processing steps, which raises cost, but the area savings of eDRAM memory offsets the process cost when a significant amount of memory is used in the design.

In current processing, moat isolation is required to prevent cross-talk of passive devices with active eDRAM arrays. In electronics, crosstalk is any phenomenon by which a signal transmitted on one circuit or channel of a transmission system creates an undesired effect in another circuit or channel. Crosstalk is usually caused by undesired capacitive, inductive or conductive coupling from one circuit (eDRAM) to another circuit. However, in current technologies, a poly filled deep trench is followed by a poly recess process which cannot avoid Reactive Ion Etching (RIE) lag between a DRAM array and a moat isolation structure. Due to this RIE lag, the moat isolation region, with the larger critical dimension (CD), always has a deeper recess depth, which prevents the moat isolation by deep trench (DT) to substrate short. Also, the interfacial layer between the metal liner, e.g., TiN, and poly causes local recess depth variation at the DRAM array.

Accordingly, there exists a need in the art to overcome the deficiencies and limitations described hereinabove.

BRIEF SUMMARY

In an aspect of the invention, a method comprises forming a deep trench for a memory array and an isolation region. The method further comprises forming a node dielectric on exposed surfaces of the deep trench for the memory array and the isolation region. The method further comprises filling remaining portions of the deep trench for the memory array with a metal, and lining the deep trench of the isolation region with the metal. The method further comprises filling remaining portions of the deep trench for the isolation region with a material, on the metal within the deep trench for the isolation region. The method further comprises recessing the metal within the deep trench for the memory array and the isolation region. The metal in the deep trench of the memory array is recessed to a greater depth than the metal in the isolation region.

In an aspect of the invention, a method comprises forming a deep trench for a DRAM array, where the deep trench for the DRAM array has a first critical dimension. The method further comprises forming a deep trench for a moat region having a second critical dimension, larger than the first critical dimension. The method further comprises lining the deep trench for the DRAM array and the deep trench for the moat region with a dielectric material, and filling the deep trench for the DRAM array with metal, formed over the dielectric material. The method further comprises lining the deep trench for the moat region with the metal, at a same time as the filling step. The metal lining the deep trench has a dimension smaller than (but larger than half) of that of the metal filling the deep trench for the DRAM array. The method further comprises filling the deep trench for the moat region with a material, formed over the metal. The method further comprises recessing the metal in the moat region and DRAM array, using a same etching process. The metal in the DRAM array is recessed more than the metal in the moat region due to etching lag.

In an aspect of the invention, a structure comprises: a deep trench for a DRAM array having a first critical dimension; a deep trench for a moat region having a second critical dimension, larger than the first critical dimension; a dielectric node lining the deep trench for the DRAM array and the deep trench for the moat region; a metal filling the first critical dimension of the deep trench for the DRAM array, formed over the dielectric node; a metal lining over the dielectric node in the deep trench for the moat region, wherein the metal lining has a dimension smaller than that of the metal filling the first critical dimension of the deep trench for the DRAM array; and a Si material formed over the metal in the deep trench for the moat region. The metal in the DRAM array is lower than the metal in the moat region due to etching lag.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the moat isolation structures which comprises the structures of the present invention. In still further embodiments, a method in a computer-aided design system is provided for generating a functional design model of the moat isolation structures. The method comprises generating a functional representation of the structural elements of the moat isolation structures.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and, more particularly, to moat isolation structures for eDRAM with heterogeneous deep trench fill and methods of manufacture. In embodiments, a deep trench for a DRAM array and moat isolation structure are filled with a metal layer. In embodiments, the metal will completely fill the deep trench of the DRAM array, while only covering sidewalls of the deep trench for the moat isolation structure. A material, e.g., Si material, then fills in the remaining portions of the moat isolation structure to form a heterogeneous deep trench fill. In embodiments, the metal deposited in the deep trench of the DRAM array is thicker than that of the metal covering sidewalls of the deep trench for the moat isolation structure. An etching process can now be performed on the metal, without any RIE lag occurring in the moat isolation structure.

Advantageously, the present invention provides improved moat isolation and eliminates or substantially reduces cross talk. For example, by using RIE selectivity between metal and material within the deep trench of the moat isolation structure and by virtue of the thickness of the metal within the moat isolation structure, it is possible to provide a shallower recess depth at the moat isolation structure, compared to the deep trench for the DRAM array. This, therefore, provides a complete solution of moat RIE lag issue. Also, in embodiments, the deep trench metal fill can be performed using a atomic layer deposition process, which provides an improved deep trench fill and thus improved depth variation. Moreover, a lower resistance in the DRAM array is achieved with the full metal fill in the deep trench of the DRAM array. Additionally, it is possible to achieve an improvement of local recess depth variation by removing (recessing) an interfacial layer between the metal, i.e., TiN, and the Si material of the array.

Figure 1:
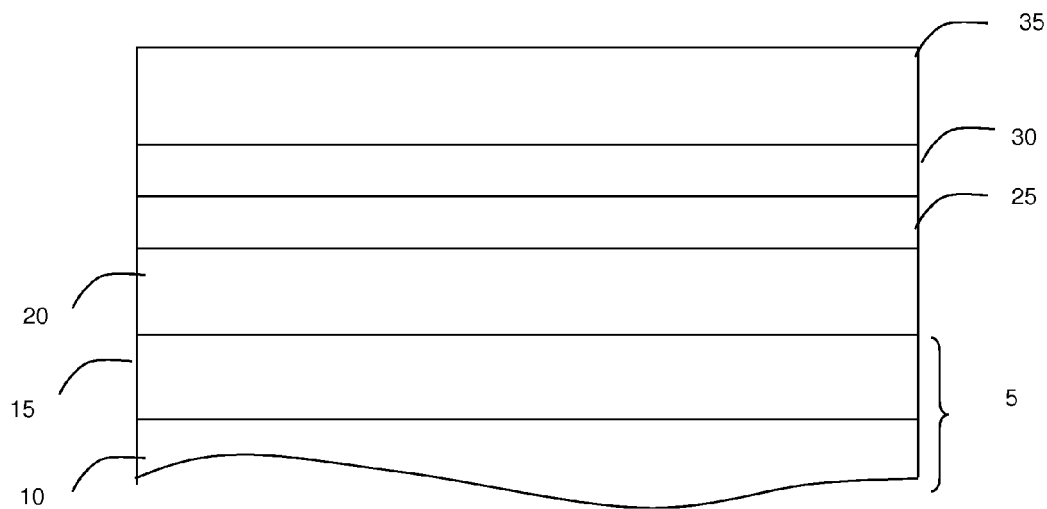
FIGS. 1-8 show structures and respective processing steps in accordance with aspects of the present invention.

FIG. 1 shows a beginning structure and respective processing steps in accordance with aspects of the present invention. In particular, the structure includes a Si based wafer 5, which comprises a substrate 10 and an epitaxial substrate 15. In embodiments, the Si wafer 5 can be, for example, any suitable semiconductor substrate including, but not limited to: Si, SiGe, SiC, SiGeC, and layered semiconductors such as silicon-on-insulator (SOI), Si/SiGe, and SiGe-on-insulator (SGOI). In embodiments, the substrate 10 can be a P-doped substrate, and the epitaxial substrate 15 can be a heavily doped N+ substrate. In one exemplary non-limiting example, the epitaxial substrate 15 can be about 3 to 4 microns thick; although other dimensions are also contemplated by the present invention. An insulator layer 20 is formed on the epitaxial substrate 15. In embodiments, the insulator layer 20 can be an oxide based material. In the case of an SOI substrate, the insulator layer 20 can be a BOX (buried oxide layer). The insulator layer 20 can be formed using SiMOX or bonding, as is known in the art.

Still referring to FIG. 1, a semiconductor layer 25, e.g., Si layer, is formed on the insulator layer 20. The semiconductor layer 25 can be formed using SiMOX or bonding, as is known in the art. A pad layer 30 such as, for example, a pad nitride layer, is formed on the semiconductor layer 25. The pad layer 30 can be formed by conventional deposition methods such as, for example, a chemical vapor deposition (CVD) process. A hard mark 35 is formed on the pad layer 30. In embodiments, the hard mask 35 is an oxide, which can be deposited using any conventional CVD process; although other processes are also contemplated by the present invention such as a High Density Plasma (HDP), or Plasma Enhanced CVD (PECVD) process.

Figure 2:
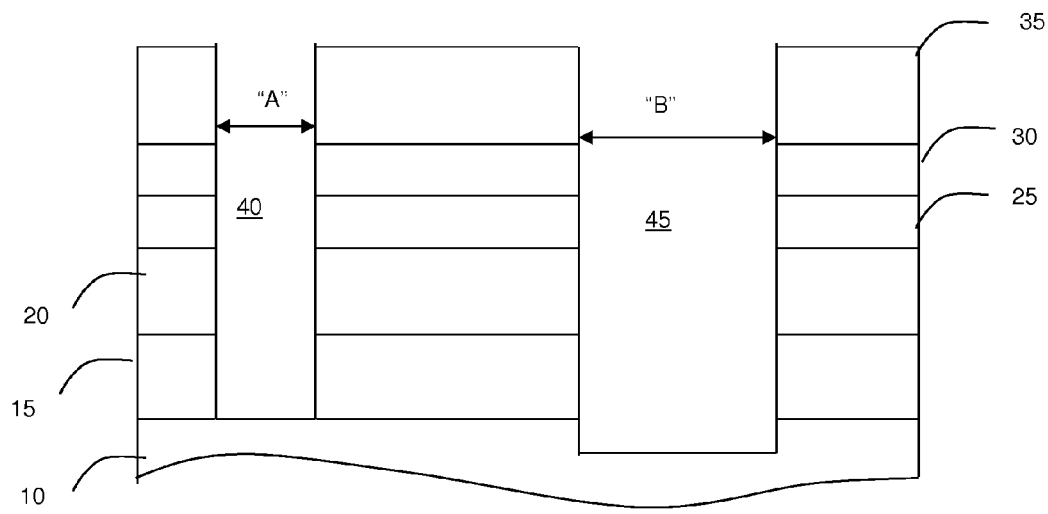

FIG. 2 shows the formation of deep trenches 40 and 45 in accordance with aspects of the present invention. In embodiments, the deep trenches 40 and 45 are formed simultaneously using conventional etching processes. In an exemplary, non-limiting example, the deep trench 40 is for a memory array, i.e., DRAM array, and the deep trench 45 is for an isolation structure, i.e., moat region. In embodiments, the deep trenches 40 and 45 are formed simultaneously using conventional reactive ion etching (RIE) processes. More specifically, a resist is placed on the hard mask 35, and exposed to energy (light) to form a pattern. A conventional etching process is then performed through the pattern to form the deep trenches 40 and 45. Subsequently, the resist can be removed using conventional ashing processes.

In embodiments, the deep trench 40 has a cross section (or critical dimension) "A", which is larger than the cross section (or critical dimension) "B" of the deep trench 45. As an exemplary embodiment, the aspect ratio of A:B is approximately 1:5; although other aspect ratios are contemplated by the present invention (with B>A). As a result, the etching processes will form the deep trench 40 through the layers 15, 20, 25 and 30, stopping slightly in or on layer 10; whereas, the etching processes will form the deep trench 45 through the layers 15, 20, 25 and 30, and extending deeper within the layer 10. In embodiments, the deep trench 45 will extend into the layer 10 by about 1 or 2 microns (due to the larger critical dimension "B").

Figure 3:
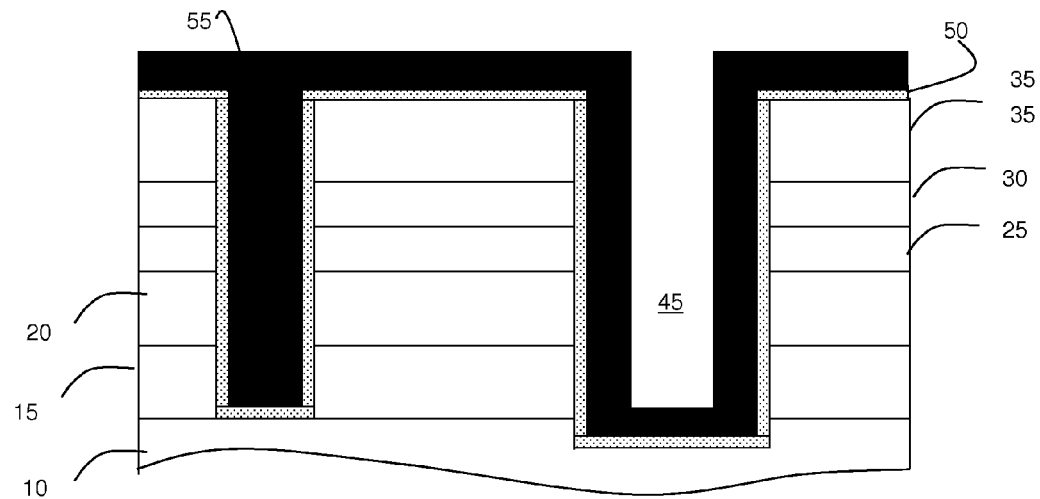

In FIG. 3, a node dielectric 50 is formed on exposed surfaces of the trenches 40 and 45 (and top surface of the structure). In embodiments, the node dielectric 50 can be a high-k dielectric such as, for example, a hafnium based material, or a low-k dielectric material such as, for example, a $SiO_2$ or SiON. The node dielectric 50 can be deposited using, for example, CVD or an atomic layer deposition (ALD) process to a depth of about 30 Å to 100 Å, depending on the type of material used for the node dielectric 50. For example, a high-k dielectric material can be deposited to about 100 Å; whereas, a lower-k dielectric can be deposited to about 30 Å.

Still referring to FIG. 3, a metal 55 is deposited on the node dielectric 50. In embodiments, the metal 50 can be deposited using an ALD, CVD, molecular layer deposition (MLD) or plating process, known to those of skill in the art. The metal 55 can be a TiN deposited simultaneously in the trenches 40 and 45; although any conventional metal or metal alloy can be implemented with the processes of the present invention. As shown in FIG. 3, the metal 55 completely fills the deep trench 40; however, the metal 55 only partially fills the deep trench 45. The metal fill is due to the different aspect ratios of the trenches 40 and 45. In embodiments, the thickness of the metal 55 in the deep trench 45 is slightly greater than 0.5 times the critical dimension (CD) of the deep trench 40. In this way, the thickness of the metal 55 in the deep trench 40 is larger than that on the surfaces (sidewalls and bottom) of the deep trench 45.

Figure 4:
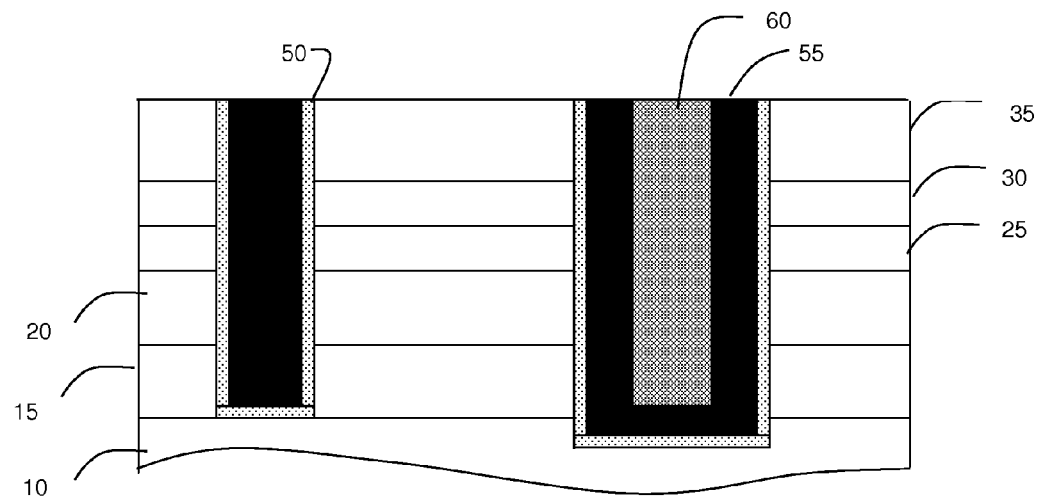

In FIG. 4, a Si material 60 is deposited on the structure, to fill the deep trench 45. More specifically, the Si material 60 is blanket deposited on the metal 55. The material 60 can be doped or undoped and structurally amorphous or poly. The material 60 can also be other CVD material including oxide or nitride based on further usage. The structure of FIG. 4 then undergoes a chemical mechanical polishing (CMP) to remove excess Si material 60, metal 55 and node dielectric 50. In this way, the CMP provides a planar surface, e.g., Si material 60, metal 55 and node dielectric 50 is planar with the hard mask 35.

Figure 5:
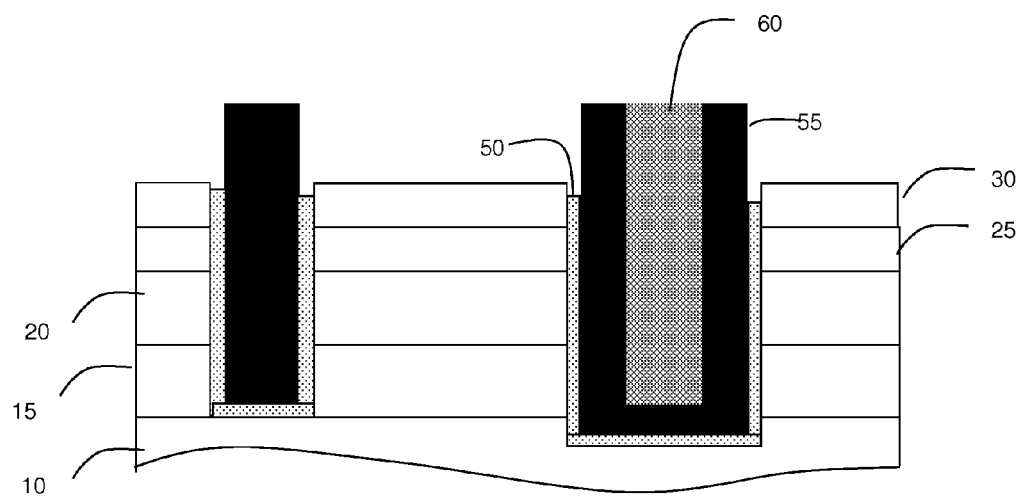

FIG. 5 shows the removal of the hard mask 35 in accordance with aspects of the present invention. More specifically, the hard mask 35 can be removed using any conventional etching process such as, for example, a wet etching process. In optional embodiments, the Si material 60, metal 55 and node dielectric 50 extending above the pad nitride layer 30 can also be removed by a conventional CMP process.

FIG. 5 additionally shows a node dielectric removal (e.g., recess) process in accordance with aspects of the present invention. More specifically, a portion of the node dielectric 50, in contact with the metal 55 above the pad nitride 30, can be removed, and additionally recessed to below a surface of the pad nitride 30. The node dielectric 50 can be removed and recessed by conventional RIE or wet etching processes, selective to the node dielectric material.

Figure 6:
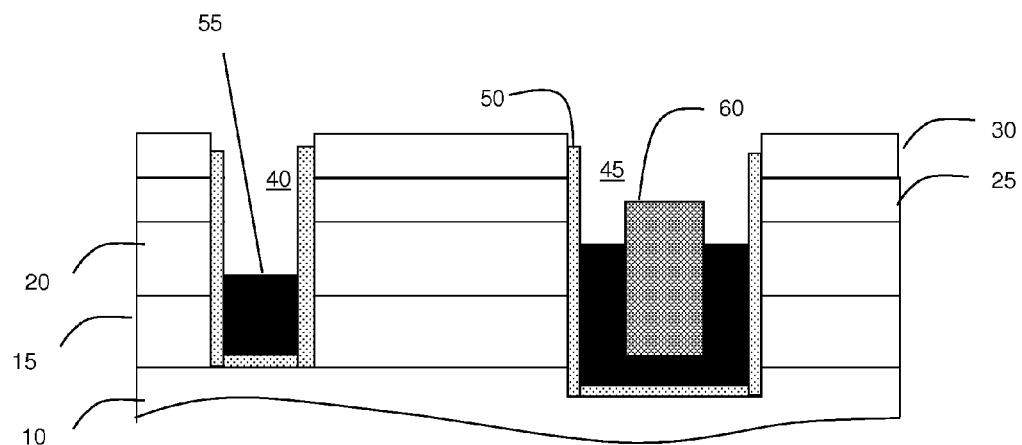

In FIG. 6, the metal 55 is recessed in both the deep trench 40 and deep trench 45. More specifically, the metal 55 is recessed simultaneously in both the deep trench 40 and deep trench 45. In embodiments, the metal 55 within the deep trench 40 is recessed to a depth lower than that of the metal 55 in the deep trench 45. This is mainly due to RIE lag, i.e., the metal 55 within the deep trench 40 will be etched quicker since it has a larger critical dimension than the metal 55 in the deep trench 45, formed on both sides of the Si material 60. Even more specifically, the RIE will etch more quickly the metal within the deep trench 40 than the deep trench 45, due to the fact that the metal 55 on both sides of the Si material 60 (in deep trench 45) is only slightly larger than 0.5 times the critical dimension of the deep trench 40. In embodiments, the metal 55 in both the deep trench 40 and deep trench 45 can be recessed to within the confines of the oxide (BOX) layer 20. This is in comparison to conventional processes, in which the metal 55 in the deep trench 45 would be recessed to a greater depth than in the deep trench 45, i.e., the metal 55 in the deep trench 45 is etched to within the confines of the epi layer 15. The Si material 60 can also be recessed using conventional etching processes.

Figure 7:
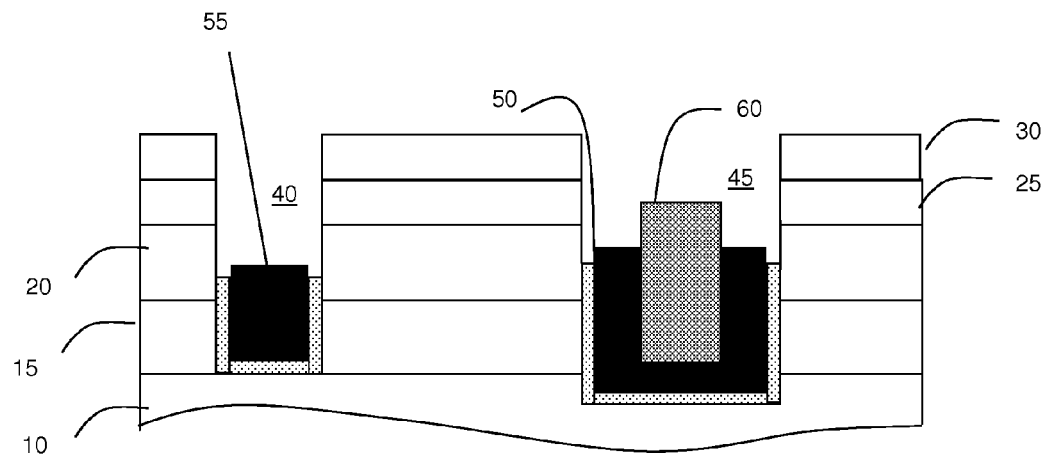

FIG. 7 shows additional processing steps in accordance with aspects of the present invention. More specifically, in FIG. 7, a portion of the node dielectric 50 within both the deep trench 40 and deep trench 45 is recessed to below a surface of the insulator layer 20, e.g., within the confines of the oxide layer 20. The node dielectric 50 can be recessed by conventional RIE or wet etching processes, selective to the node dielectric material.

Figure 8:
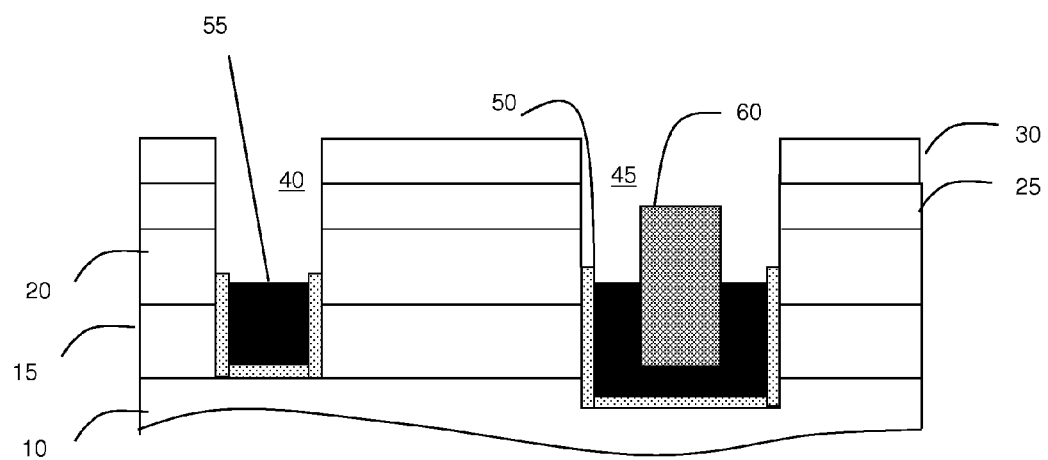

In FIG. 8, the metal 55 is further recessed in both the deep trench 40 and deep trench 45. In embodiments, the metal 55 is simultaneously recessed in both the deep trench 40 and deep trench 45. In embodiments, the metal 55 within the deep trench 40 is recessed to a depth lower than that of the metal 55 in the deep trench 45. This, again, is mainly due to RIE lag as described above. In embodiments, the metal 55 in both the deep trench 40 and deep trench 45 can be recessed to a lower region within the confines of the oxide (BOX) layer 20, to achieve a greater process margin. More specifically, the metal 55 in both the deep trench 40 and deep trench 45 can be recessed so that it will not be damaged during subsequent processing of the layers 25 and 30, e.g., Shallow Trench Isolation (STI) process or back end of the line (BEOL) processing.

Figure 9:
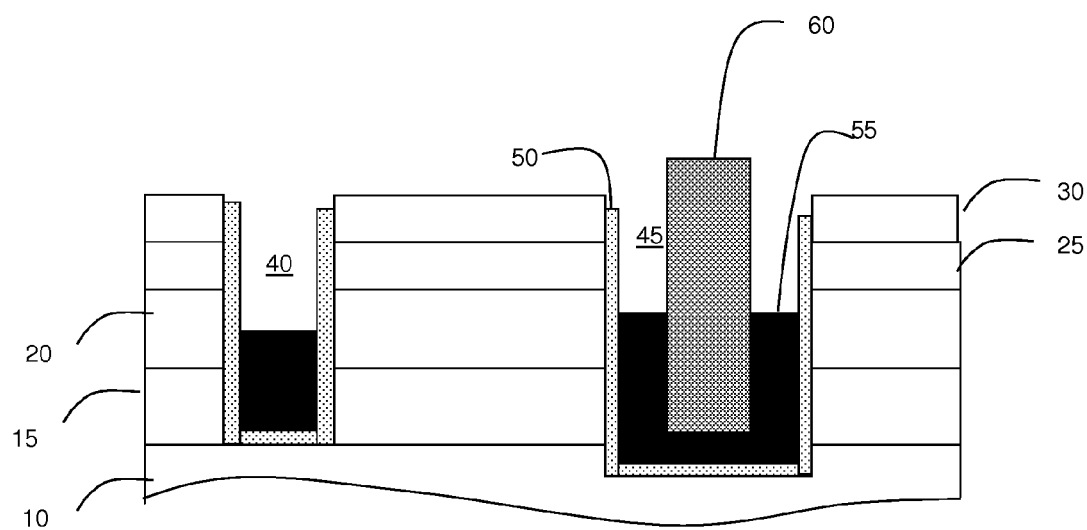
FIGS. 9 and 10 show alternative structures and respective processing steps in accordance with additional aspects of the present invention.
Figure 10:
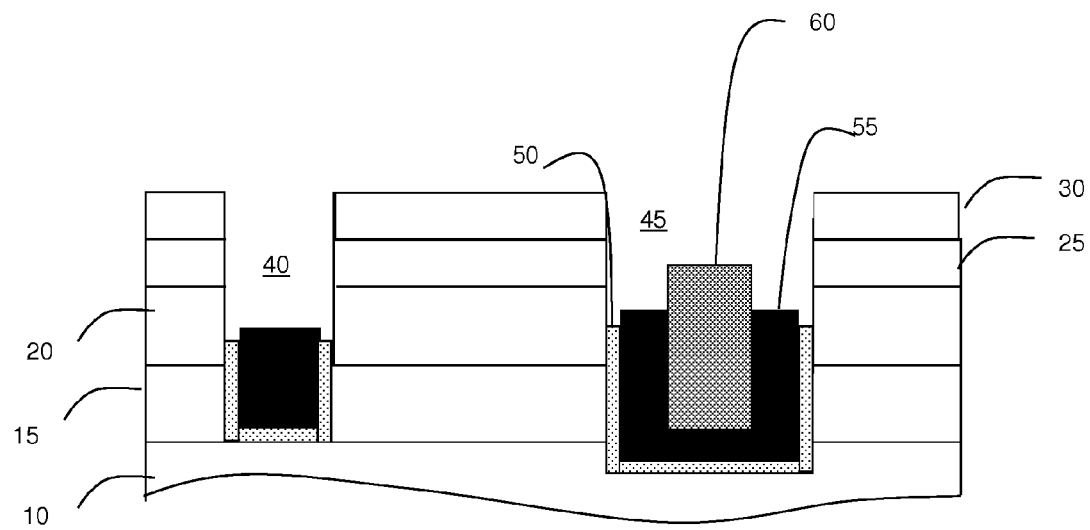

FIGS. 9 and 10 show alternative structures and respective processing steps in accordance with additional aspects of the present invention. Starting from the structure of FIG. 5, for example, in FIG. 9, the metal 55 is recessed in both the deep trench 40 and deep trench 45 to below the node dielectric 50, and more specifically, within the confines of the insulator layer 20. As in previous embodiments, the metal 55 within the deep trench 40 is recessed to a depth lower than that of the metal 55 in the deep trench 45 due to RIE lag. In embodiments, the metal 55, in both the deep trench 40 and deep trench 45, can be recessed to within the confines of the oxide (BOX) layer 20 using a selective wet etch of the metal 55.

In FIG. 10, the node dielectric 50 is recessed in accordance with aspects of the present invention. More specifically, a portion of the node dielectric 50 is recessed to below a surface of the insulator layer 20 using, for example, conventional RIE or wet etching processes, selective to the node dielectric material. In embodiments, the insulator layer 20 is recessed to a level below the metal 55.

Figure 11:
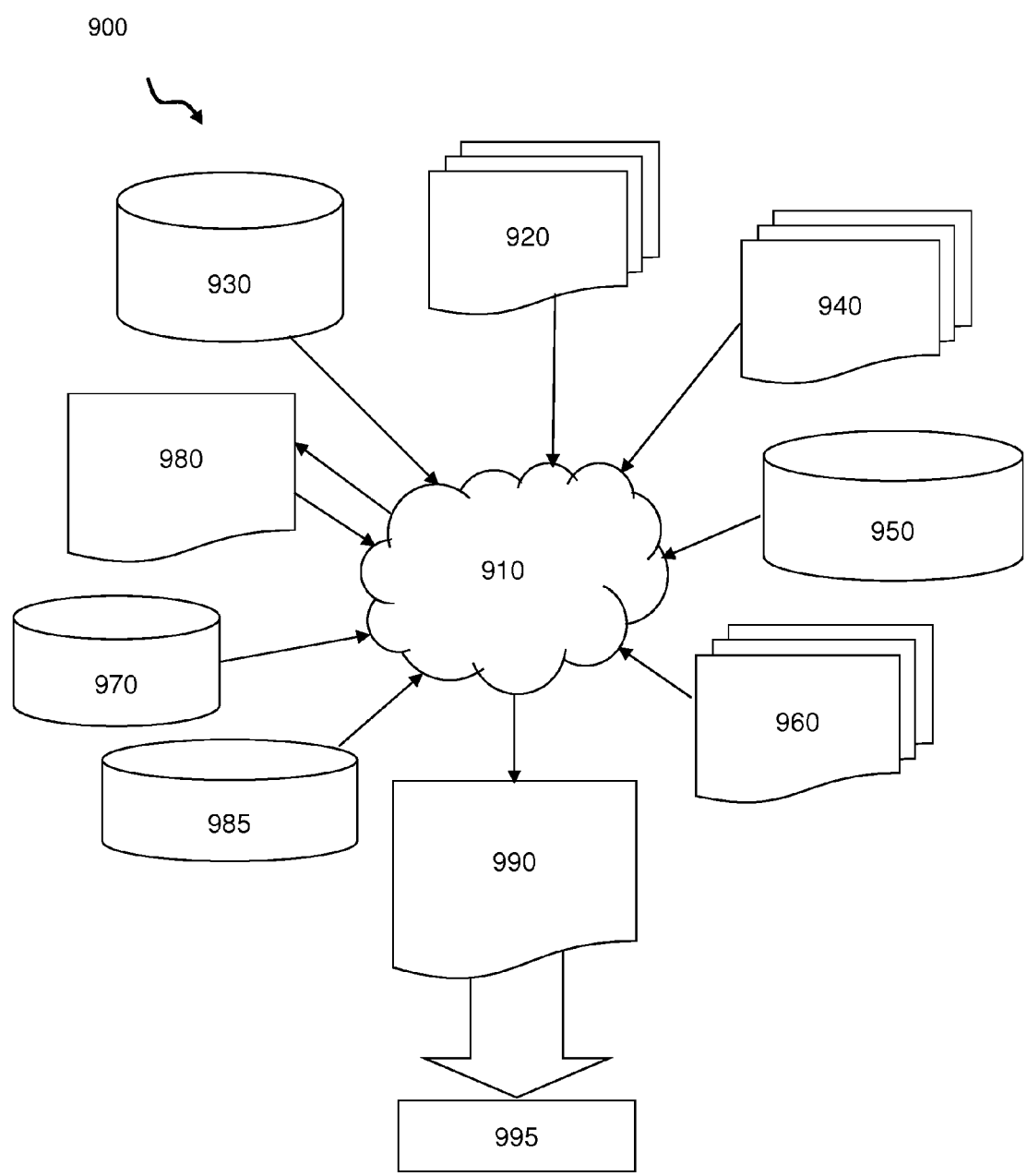
FIG. 11 is a flow diagram of a design process used in semiconductor design, manufacture, and/or test.

FIG. 11 is a flow diagram of a design process used in semiconductor design, manufacture, and/or test. FIG. 11 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-10. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 11 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-10. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-10 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 22 nm, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-10. In one embodiment, design structure 990 may comprise a compiled, executable HDL simulation model that functionally simulates the devices shown in FIGS. 1-10.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-10. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein. Many modifications and variations will be apparent to those of ordinary skill in the art without departing from the scope and spirit of the invention. The corresponding structures, materials, acts, and equivalents of all means or step plus function elements in the claims, if applicable, are intended to include any structure, material, or act for performing the function in combination with other claimed elements as specifically claimed. Accordingly, while the invention has been described in terms of embodiments, those of skill in the art will recognize that the invention can be practiced with modifications and in the spirit and scope of the appended claims.

What is claimed:
1. A structure, comprising:
a deep trench having sidewalls and a bottom in a DRAM array having a first critical dimension;
a deep trench having sidewalls and a bottom in a moat region having a second critical dimension, larger than the first critical dimension;

a dielectric node lining at least a portion of the sidewalls and an entire a bottom of the deep trench in the DRAM array and at least a portion of the sidewalls and an entire a bottom of the deep trench in the moat region;

a metal filling the first critical dimension of the deep trench in the DRAM array, formed over the dielectric node;

a metal lining over the dielectric node in the deep trench in the moat region, wherein the metal lining has a dimension smaller than that of the metal filling the first critical dimension of the deep trench in the DRAM array; and a Si material formed over the metal in the deep trench in the moat region, wherein the metal in the DRAM array is lower than the metal lining in the moat region due to RIE lag.

2. The structure of claim 1, wherein the metal in the DRAM array and the metal lining in the moat region is TiN.

3. The structure of claim 2, wherein the dielectric node lining is a high-k dielectric.

4. The structure of claim 3, wherein the dielectric node lining is about 100 Å thickness.

5. The structure of claim 1, wherein the metal in the DRAM array is thicker than the metal lining in the moat region.

6. The structure of claim 5, wherein the metal lining in the moat region is slightly greater than 0.5 times a dimension of the metal in the DRAM array.

7. The structure of claim 1, wherein the metal in the moat region is below a surface of a substrate.

8. The structure of claim 7, wherein the Si material is below the surface of the substrate.

9. The structure of claim 8, wherein the Si material in the moat region is raised above a surface of the metal lining in the moat region.

10. The structure of claim 8, wherein the metal in the DRAM array and the metal lining in the moat region is recessed to below the dielectric node lining.

11. The structure of claim 8, wherein the metal in the DRAM array and the metal lining in the moat region is above the dielectric node lining provided on a surface of a sidewall of the deep trenches for the DRAM array and the moat region.

12. The structure of claim 1, wherein the deep trench in the DRAM array and the deep trench in the moat region are both formed over a common substrate and both extend at least to an upper surface of the common substrate.

13. The structure of claim 12, wherein the deep trench in the moat region is deeper than the deep trench in the DRAM array, and extends into the common substrate.

14. The structure of claim 13, wherein the deep trench in the DRAM array is formed so that a bottom of the deep trench in the DRAM array is in contact with an upper surface of the common substrate.

15. The structure of claim 13, wherein the deep trench in the DRAM array extends into the upper surface of the common substrate to a first depth which is less than a depth which the deep trench in the moat region extends into the upper surface of the common substrate.

* * * * *